(12) United States Patent
Kitaoka et al.

(10) Patent No.: US 11,513,013 B2
(45) Date of Patent: Nov. 29, 2022

(54) STRESS DISTRIBUTION MEASUREMENT DEVICE AND STRESS DISTRIBUTION MEASUREMENT METHOD

(71) Applicant: Hitachi, Ltd., Tokyo (JP)

(72) Inventors: Masanori Kitaoka, Tokyo (JP); Hisashi Endo, Tokyo (JP); Hiroshi Yoshikawa, Tokyo (JP); Toshihiro Yamada, Tokyo (JP); Nobuhiro Kakeno, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 175 days.

(21) Appl. No.: 17/008,838

(22) Filed: Sep. 1, 2020

(65) Prior Publication Data
US 2021/0063255 A1  Mar. 4, 2021

(30) Foreign Application Priority Data

Sep. 2, 2019  (JP) .............................. JP2019-159213

(51) Int. Cl.
*G01L 1/00* (2006.01)
*G01L 1/12* (2006.01)
(Continued)

(52) U.S. Cl.
CPC .............. *G01L 1/125* (2013.01); *G01L 1/225* (2013.01); *G01R 33/0327* (2013.01)

(58) Field of Classification Search
CPC ...... G01L 1/125; G01L 1/225; G01R 33/0327
See application file for complete search history.

(56) References Cited

U.S. PATENT DOCUMENTS 2,574,647 A  *  11/1951  Lorenzen ................. H03C 3/28
                                                        331/157
4,247,819 A       1/1981  Shimada et al.
(Continued)

FOREIGN PATENT DOCUMENTS

CN       108982655 B  *  4/2022  ............. G01N 27/90
JP        54-47697 A       4/1979
(Continued)

OTHER PUBLICATIONS

Japanese-language Office Action issued in Japanese Application No. 2019-159213 dated Aug. 30, 2022 with English translation (eight (8) pages).

*Primary Examiner* — Max H Noori
(74) *Attorney, Agent, or Firm* — Crowell & Moring LLP

(57) ABSTRACT

A stress distribution measurement device includes: a first magnetostrictive sensor and a second magnetostrictive sensor each including an excitation coil that excites AC magnetism in a measurement target using alternating current, and a detection coil to which alternating current is induced due to the AC magnetism flowing in the measurement target; an excitation circuit that applies a first excitation voltage to the excitation coil of the first magnetostrictive sensor and applies a second excitation voltage to the excitation coil of the second magnetostrictive sensor, the second excitation voltage having a phase or a waveform different from the first excitation voltage; and a detection circuit that includes a first detector that performs synchronous detection of current flowing in the detection coil of the first magnetostrictive sensor based on the first excitation voltage and a second detector that performs synchronous detection of current flowing in the detection coil of the second magnetostrictive sensor based on the second excitation voltage.

8 Claims, 13 Drawing Sheets

(51) Int. Cl.
   *G01L 1/22*      (2006.01)
   *G01R 33/032*    (2006.01)

(56) References Cited

U.S. PATENT DOCUMENTS

| | | | | |
|---|---|---|---|---|
| 5,419,207 | A * | 5/1995 | Kobayashi | G01D 3/036 |
| | | | | 324/225 |
| 9,092,024 | B2 * | 7/2015 | O'Neil | G05B 19/40 |
| 2004/0112148 | A1 * | 6/2004 | Sakai | B62D 15/0215 |
| | | | | 73/862.331 |
| 2009/0085557 | A1 * | 4/2009 | Krozer | G01R 33/12 |
| | | | | 324/201 |
| 2009/0145239 | A1 | 6/2009 | Girshovich et al. | |
| 2010/0077870 | A1 * | 4/2010 | Sakai | G01L 3/105 |
| | | | | 73/862.334 |
| 2015/0277280 | A1 * | 10/2015 | Aikawa | G03G 15/0853 |
| | | | | 324/228 |

FOREIGN PATENT DOCUMENTS

| | | | |
|---|---|---|---|
| JP | 57-137828 | A | 8/1982 |
| JP | 3130116 | B2 | 1/2001 |
| JP | 2001-228038 | A | 8/2001 |

\* cited by examiner

STRESS DISTRIBUTION MEASUREMENT DEVICE AND STRESS DISTRIBUTION MEASUREMENT METHOD

BACKGROUND OF THE INVENTION

1. Field of the Invention

The present invention relates to a stress distribution measurement device and a stress distribution measurement method.

2. Description of the Related Art

A load acting on a ferromagnetic material results in an anisotropic magnetic permeability with the magnetic permeability being larger in a direction of the load and smaller in a direction orthogonal to the direction of the load. Magnetostrictive stress measurement methods rely on this mechanism. Specifically, a magnetostrictive sensor detects a difference between the magnetic permeabilities, to measure the direction and the magnitude of the principal stress. The magnetostrictive stress measurement method enables contactless measurement of the stress, so that the magnetostrictive sensor can be easily installed in a manufacturing process for a metal product. The magnetostrictive sensor measures the stress on the metal product before and after the manufacturing process. A difference between the stresses thus measured is calculated, so that a change in the stress before and after each process can be recognized. In general, a change in the stress in a manufacturing process affects the quality of the product. Thus, the change in the stress measured may be used for product quality management.

Meanwhile, the product quality may not only be affected by the stress at one point on the surface of the metal product, but may also be affected by the stress distribution and the stress unevenness on the target surface. In view of this, there has been a need for a method of measuring the stress distribution and the stress unevenness on the target surface, by means of a magnetostrictive stress measurement method with which stress can be measured in a non-contact manner. As a method for addressing such a problem, for example, claim 1 of Japanese Patent No. 3130116 describes "A magnetostrictive stress measurement method for a welded pipe, the method comprising: measuring stress over a circumferential direction of a pipe with magnetostrictive sensors moving in the circumferential direction, the magnetostrictive sensors being disposed at at least two positions with a gap interposed therebetween in a pipe axial direction and deriving an output V from a difference in magnetic permeabilities in the pipe axial direction and the circumferential direction; determining, out of stress measurement values over at least two circumferential directions, a singular value appearing over a range $\Delta\theta 1$ of positions in the same circumferential direction as a stress measurement value of a welded portion of the pipe; removing the stress measurement value of the welded portion of the pipe from the stress measurement values over the circumferential directions; approximating a residual stress measurement value with a cosine waveform corresponding to an angle around the pipe axis; and determining stress corresponding to an amplitude B thereof".

SUMMARY OF THE INVENTION

In Japanese Patent No. 3130116 mentioned above, the magnetostrictive stress measurement target is a "pipe". However, the method disclosed in Japanese Patent No. 3130116 is expected to be usable for measuring the magnetostrictive stress of any shape other than the "pipe" such as a flat plate. Specifically, the target surface is scanned by the magnetostrictive sensor to measure the stress over the scanning direction. Then, the stress thus measured is associated with the position of the magnetostrictive sensor. In this manner, the static stress distribution and the stress unevenness on the target surface should be measurable. Meanwhile, when the measurement target undergoes a manufacturing process such as machining, cutting, and welding, not only the amount of change in the stress before and after the process but also the change in the stress during the process may affect the product quality. Such a change during the process generally results in a change in the stress distribution within a short period of time that is difficult to measure because it is difficult to perform the sensor scanning with a speed faster than the speed of the change in the stress distribution. Furthermore, as a simple solution, the stress distribution may be measured using a plurality of magnetostrictive sensors. However, this involves noise (crosstalk noise) due to a leakage magnetic flux from the adjacent magnetostrictive sensors, rendering the stress difficult to be measured accurately.

The present invention is made in view of the above circumstances, and an object of the present invention is to provide a stress distribution measurement device and a stress distribution measurement method with which the stress on a measurement target can be appropriately measured.

A stress distribution measurement device according to the present invention to achieve the object described above includes: a first magnetostrictive sensor and a second magnetostrictive sensor each including an excitation coil that excites AC magnetism in a measurement target using alternating current, and a detection coil to which alternating current is induced due to the AC magnetism flowing in the measurement target; an excitation circuit that applies a first excitation voltage to the excitation coil of the first magnetostrictive sensor and applies a second excitation voltage to the excitation coil of the second magnetostrictive sensor, the second excitation voltage having a phase or a waveform different from the first excitation voltage; and a detection circuit that includes a first detector that performs synchronous detection of current flowing in the detection coil of the first magnetostrictive sensor based on the first excitation voltage and a second detector that performs synchronous detection of current flowing in the detection coil of the second magnetostrictive sensor based on the second excitation voltage.

With the present invention, the stress on a measurement target can be appropriately measured.

BRIEF DESCRIPTION OF THE DRAWINGS

FIG. 2 is a circuit diagram of a magnetic equivalent circuit for the magnetostrictive sensor, a measurement target, and the like;

FIG. 4 is a circuit diagram of another magnetic equivalent circuit for the magnetostrictive sensor, the measurement target, and the like;

DESCRIPTION OF THE PREFERRED EMBODIMENTS

<Basic Principle of Stress Measurement>

Now, a stress distribution measurement device according to an embodiment of the present invention will be described. First of all, the principle of stress measurement according to the present embodiment will be described.

Figure 1:
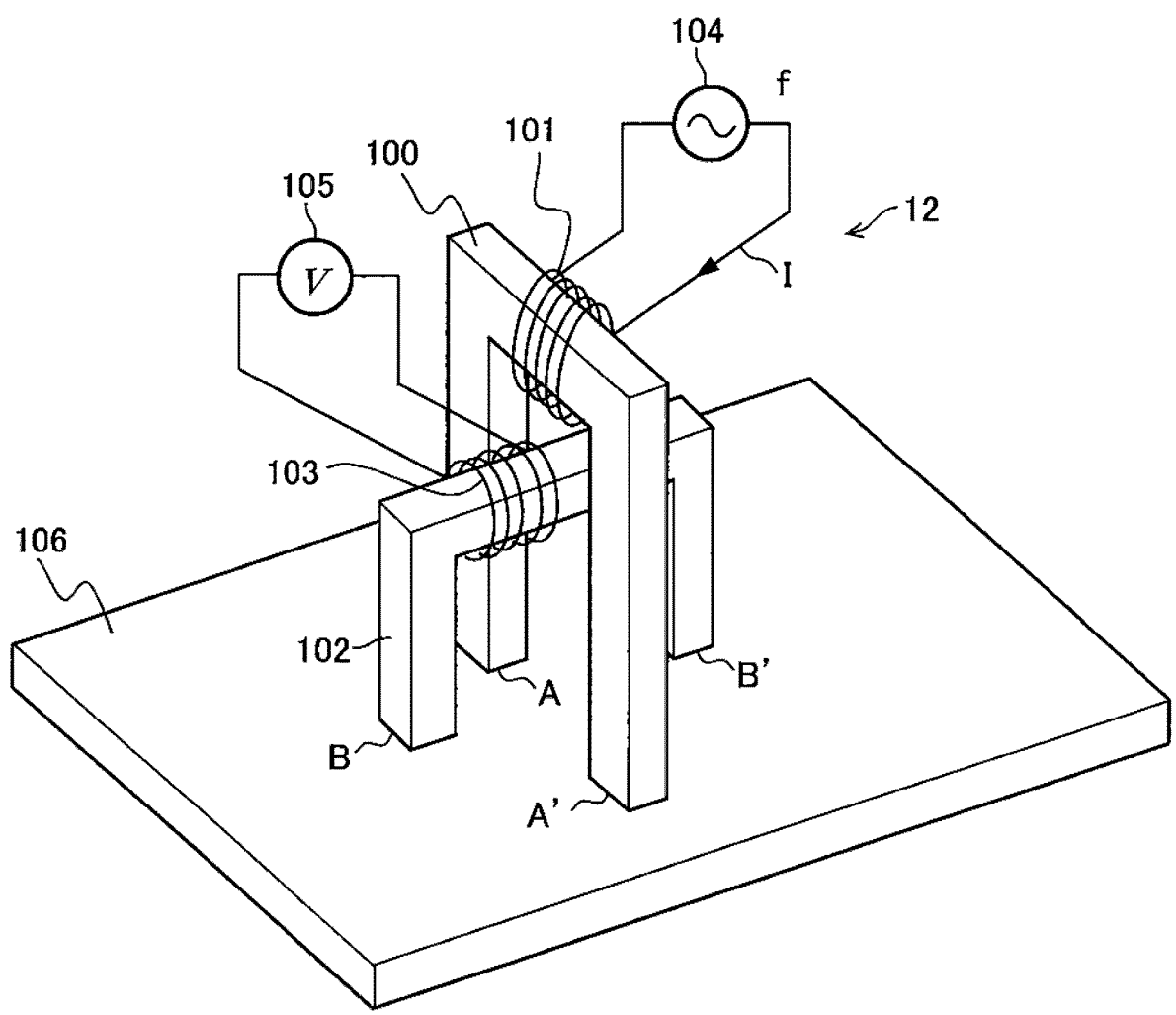
FIG. 1 is a schematic view of a magnetostrictive sensor applied to an embodiment of the present invention.

FIG. 1 is a schematic view of a magnetostrictive sensor 12 applied to the present embodiment.

The magnetostrictive sensor 12 includes an excitation core 100, an excitation coil 101, a detection core 102, a detection coil 103, an oscillation circuit 104, and a detector 105. The excitation core 100 and the detection core 102 are formed in a U shape, and each have both ends facing a measurement target 106. The excitation coil 101 and the detection coil 103 are respectively wound around the excitation core 100 and the detection core 102.

Magnetic poles at both ends of the excitation core 100 are referred to as magnetic poles A and A', and magnetic poles at both ends of the detection core 102 are referred to as magnetic poles B and B'. The magnetic poles A and A' are arranged at one of the vertical angle positions of a square (not shown), and the magnetic poles B and B' are arranged at the other vertical angle positions of the square. The oscillation circuit 104 that generates alternating current at a predetermined excitation frequency f is connected to the excitation coil 101. The current flowing through the excitation coil 101 is referred to as excitation current I. When the excitation current I is supplied to the excitation coil 101, a magnetic flux is generated in the excitation core 100. The magnetic flux in the excitation core 100 flows into the measurement target 106 through the magnetic poles A and A'. Then, a part of the magnetic flux flowing in the measurement target 106 flows into the detection core 102 through the magnetic poles B and B'. As a result, output voltage V is induced in the detection coil 103. The detector 105 measures this output voltage V.

When the measurement target 106 has a positive magnetostriction constant, application of stress to the measurement target 106 leads to a change in a relative magnetic permeability in a stress direction due to inverse magnetostriction effect, resulting in magnetic anisotropy. Thus, the application of the stress results in the magnitude of the magnetic resistance in the measurement target 106 varying among directions, and the output voltage V induced in the detection coil 103 varies depending on the stress. Thus, with the relationship between the output voltage V of the detection coil 103 and the stress measured in advance for calibration, the stress applied to the measurement target 106 can be measured based on the output voltage V.

Figure 2:
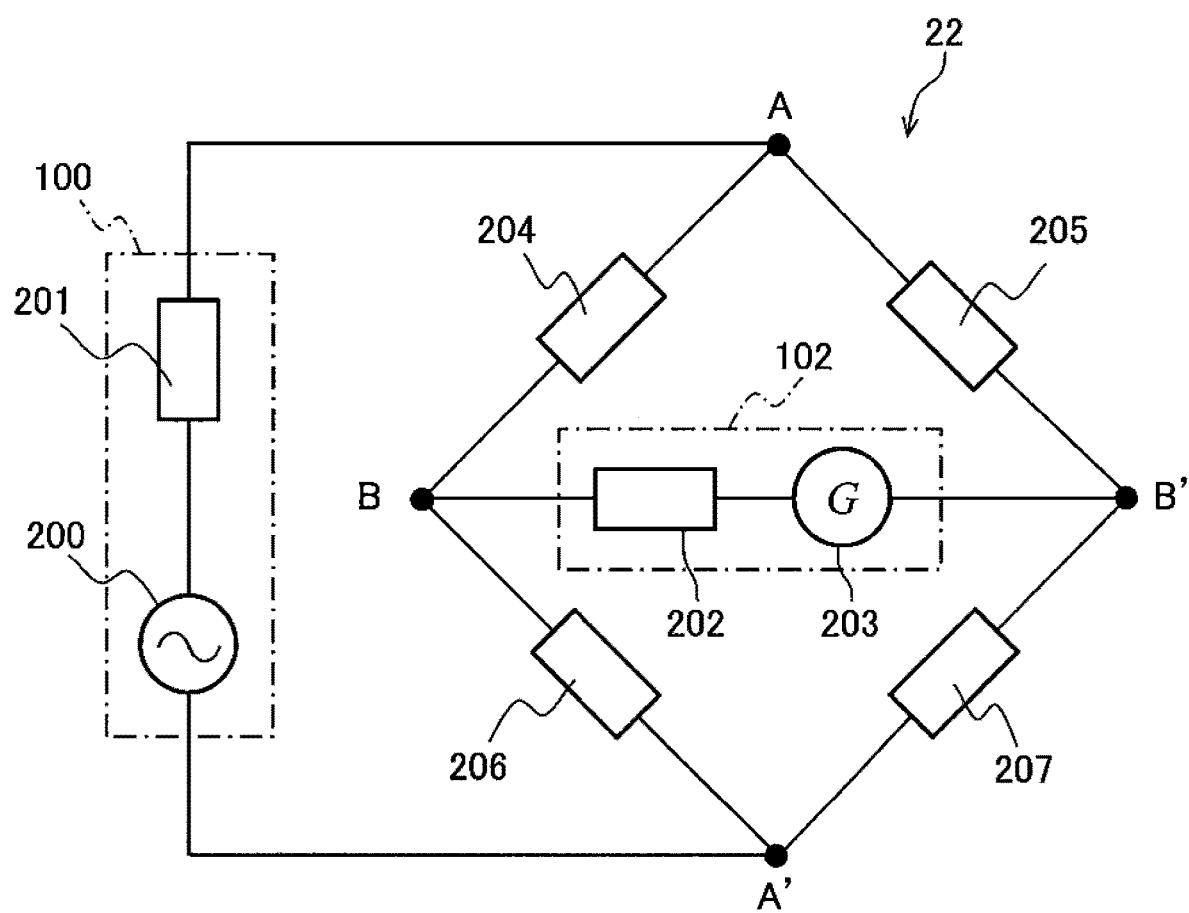

FIG. 2 is a circuit diagram of a magnetic equivalent circuit 22 for the magnetostrictive sensor 12, the measurement target 106, and the like as illustrated in FIG. 1. The magnetic equivalent circuit 22 includes magnetomotive force 200, magnetic resistances 201 and 202, a measurement unit 203, and magnetic resistances 204 to 207. The magnetomotive force 200 is magnetomotive force flowing through the excitation coil 101 due to the excitation current I (see FIG. 1). Furthermore, the magnetic resistances 201 and 202 are magnetic resistances respectively in the excitation core 100 and the detection core 102. The measurement unit 203 corresponds to the detector 105 and measures the magnetic flux flowing through the detection core 102.

The magnetic resistances 204 to 207 are magnetic resistances respectively between the magnetic poles A and B, between A and B', between A' and B, and between A' and B' in the measurement target 106 (see FIG. 1). Under a no-stress condition where no stress is applied to the measurement target 106, the magnetic resistances 204 to 207 have the same resistance value, and the magnetic flux flowing through the detection core 102 is zero in the ideal magnetic pole arrangement. On the other hand, when stress is applied to the measurement target 106, the values of the magnetic resistances 204 to 207 change. As a result, a magnetic flux flows through the detection core 102 to be detected by the measurement unit 203.

<Problem Due to Interference Between Sensors>

A change in the stress distribution on the measurement target 106 is expected to be measurable within a shorter period of time when a plurality of the magnetostrictive sensors 12 illustrated in FIG. 1 are arranged along the surface of the measurement target 106. However, such a configuration involves a problem in that interference occurs between the magnetostrictive sensors 12. This will be described in detail with reference to FIGS. 3 and 4.

Figure 3:
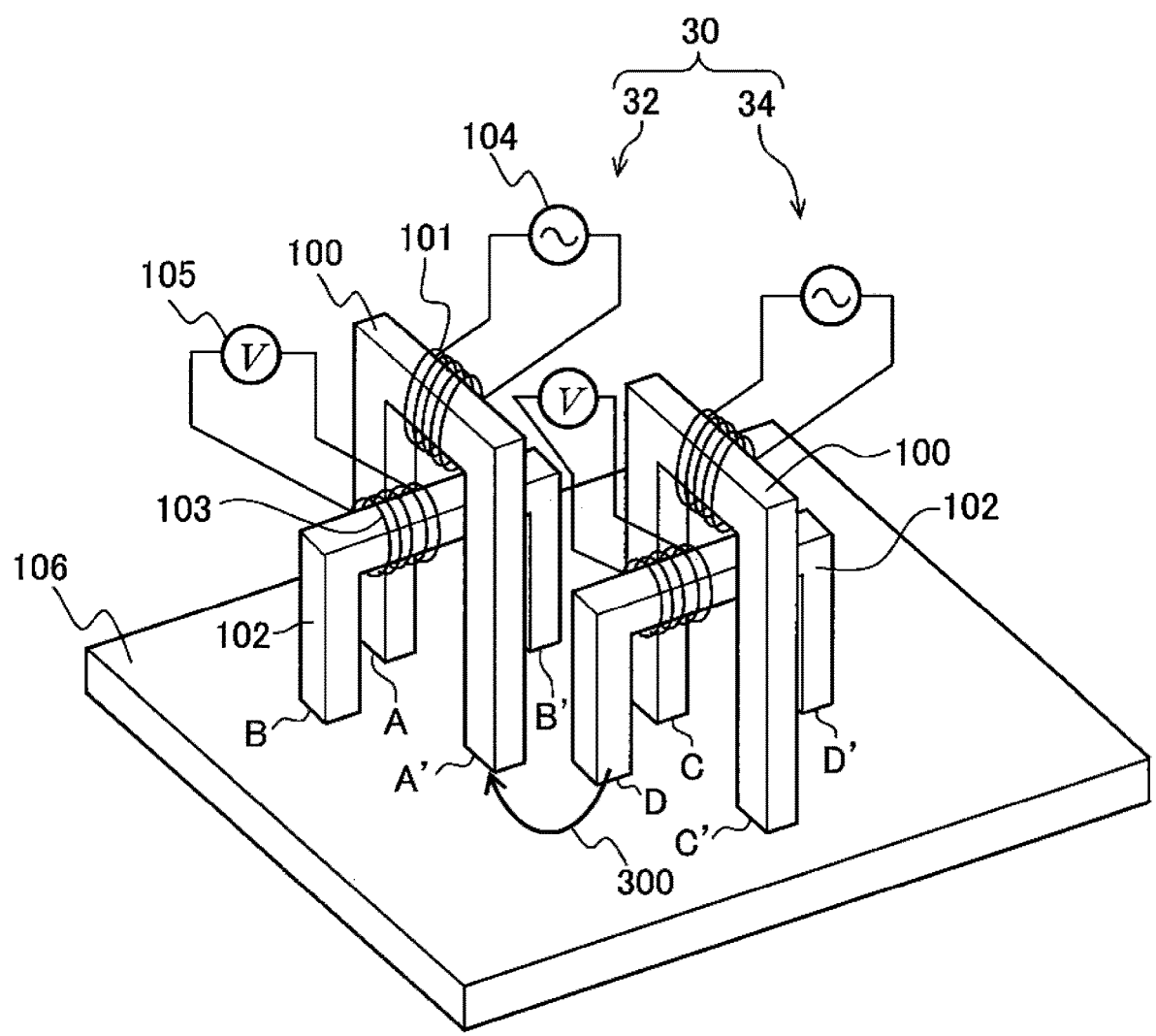
FIG. 3 is a schematic view of a magnetostrictive sensor group.

FIG. 3 is a schematic view of a magnetostrictive sensor group 30. The magnetostrictive sensor group 30 includes two magnetostrictive sensors 32 and 34. The magnetostrictive sensors 32 and 34 both have a configuration that is similar to that of the magnetostrictive sensor 12 illustrated in FIG. 1.

In the magnetostrictive sensor 34, magnetic poles at both ends of the excitation core 100 are referred to as magnetic poles C and C', and magnetic poles at both ends of the detection core 102 are referred to as magnetic poles D and D'. The magnetostrictive sensors 32 and 34 have the magnetic poles A' and B' and the magnetic poles C and D arranged close to each other. In this arrangement, the magnetic flux flowing from the magnetic poles C and D to the measurement target 106 is expected to flow into the magnetic poles A' and B' as a leakage magnetic flux 300. The leakage magnetic flux 300 is detected by the detection coils 103 of the magnetostrictive sensors 32 and 34 as noise (hereinafter, referred to as crosstalk noise).

Figure 4:
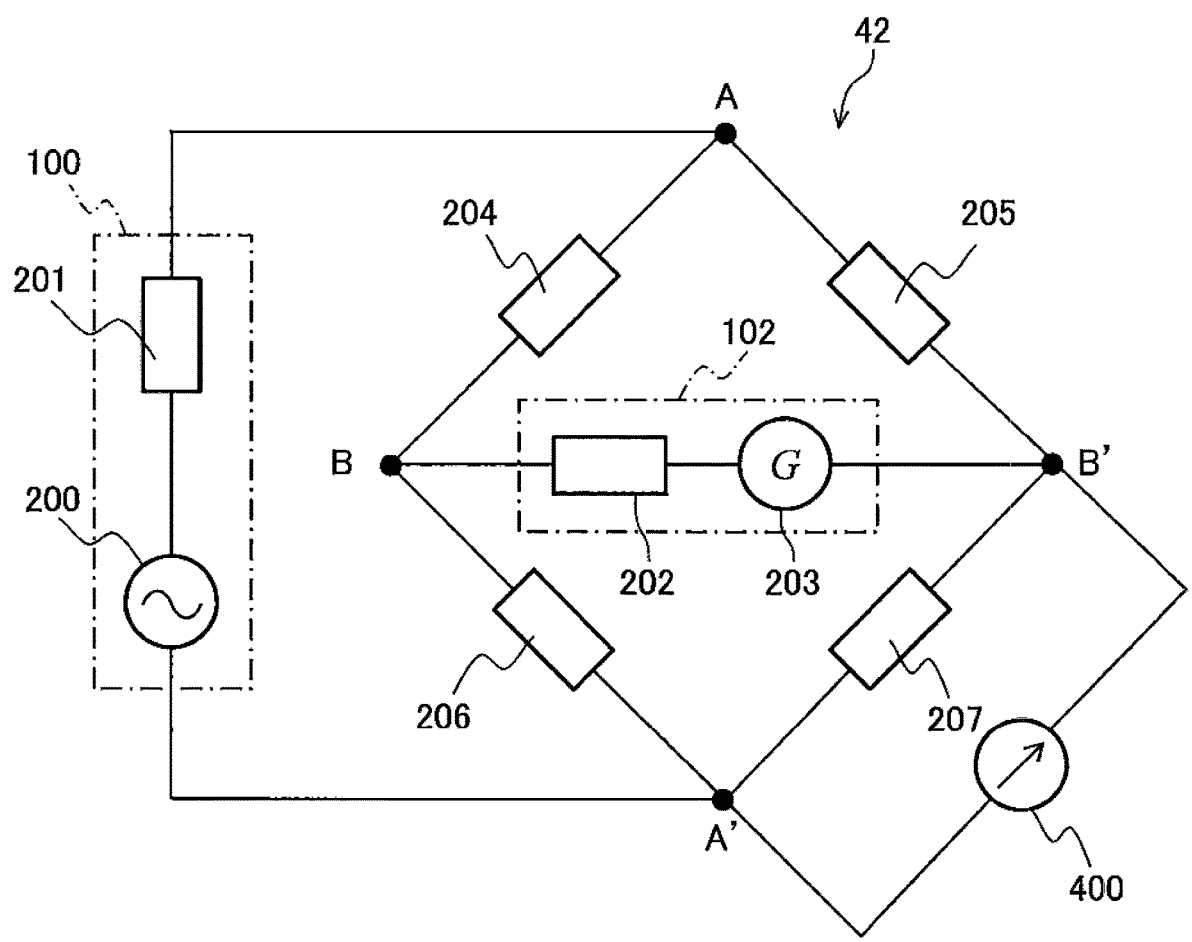

FIG. 4 is a circuit diagram of a magnetic equivalent circuit 42 for the magnetostrictive sensor 32, the measurement target 106, and the like as illustrated in FIG. 3. In the magnetic equivalent circuit 42, a leakage magnetic flux generation source 400 is connected in parallel with the magnetic resistance 207. The configuration of the magnetic equivalent circuit 42 other than this is similar to that of the magnetic equivalent circuit 22 (see FIG. 2). The leakage magnetic flux generation source 400 in FIG. 4 corresponds to the leakage magnetic flux 300 illustrated in FIG. 3. FIG. 4 illustrates a case where the leakage magnetic flux 300 flows between the magnetic poles A' and B', but the magnetic poles into which the leakage magnetic flux 300 actually flows are not limited to the magnetic poles A' and B'. When the crosstalk noise occurs due to the leakage magnetic flux 300 thus flowing into the detection core, there is a problem in that a measurement result obtained with each of the magnetostrictive sensors 32 and 34 (see FIG. 3) is inaccurate.

Configuration of Embodiment (Overall Configuration)

Figure 5:
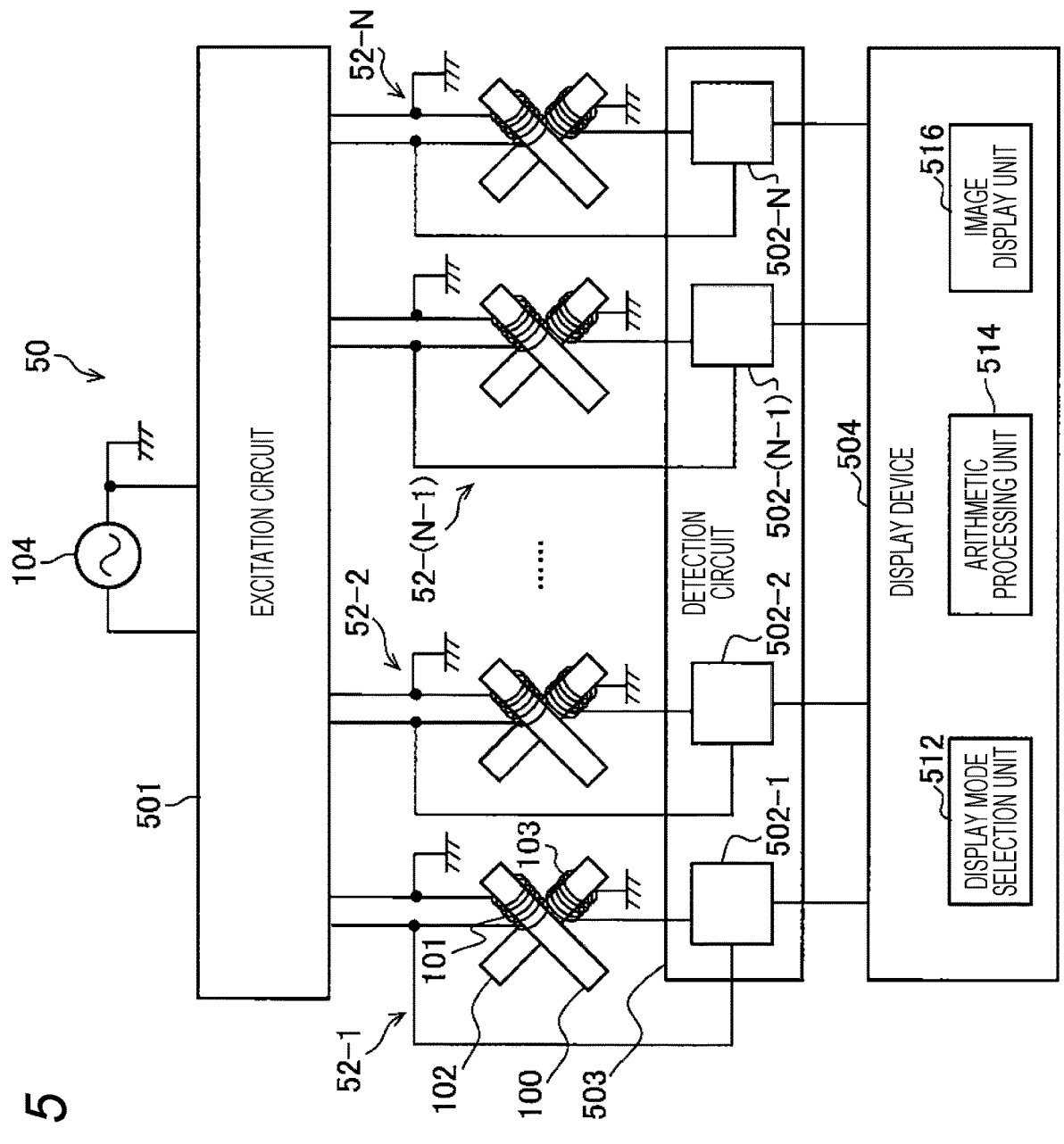
FIG. 5 is a block diagram illustrating an overall configuration of a stress distribution measurement device according to the present embodiment.

FIG. 5 is a block diagram illustrating an overall configuration of a stress distribution measurement device 50 according to the present embodiment.

In FIG. 5, the stress distribution measurement device 50 includes an oscillation circuit 104, an excitation circuit 501, a plurality of (N) magnetostrictive sensors 52-1 to 52-N (first magnetostrictive sensor, second magnetostrictive sensor, . . . , and Nth magnetostrictive sensor), a detection circuit 503, and a display device 504. Each of the magnetostrictive sensors 52-1 to 52-N has a configuration obtained by removing the oscillation circuit 104 and the detector 105 from the magnetostrictive sensor 12 (see FIG. 1) described above.

The oscillation circuit 104 outputs an AC voltage at a predetermined excitation frequency f. The excitation circuit 501 supplies an excitation current to the excitation coil 101 of each of the magnetostrictive sensors 52-1 to 52-N by applying excitation voltage. The excitation circuit 501 will be described in detail later. The detection circuit 503 includes a plurality of (N) detectors 502-1 to 502-N (first detector, second detector, . . . , and Nth detector). These detectors 502-1 to 502-N each measure the output voltage V of the detection coil 103 (see FIG. 1) in the corresponding one of the magnetostrictive sensors 52-1 to 52-N. Hereinafter, the magnetostrictive sensors 52-1 to 52-N may be collectively referred to as "magnetostrictive sensor 52". Furthermore, the detectors 502-1 to 502-N may be collectively referred to as "detector 502".

The display device 504 displays an output signal from the detection circuit 503, and includes a display mode selection unit 512, an arithmetic processing unit 514, and an image display unit 516. The image display unit 516 displays image data supplied. The display mode selection unit 512 selects a display mode of the image display unit 516 from a plurality of candidates. The arithmetic processing unit 514 performs arithmetic processing on the output signal from the detection circuit 503 based on the display mode selected by the display mode selection unit 512, and supplies the resultant image data obtained to the image display unit 516.

(Configuration of Excitation Circuit 501)

Figure 6:
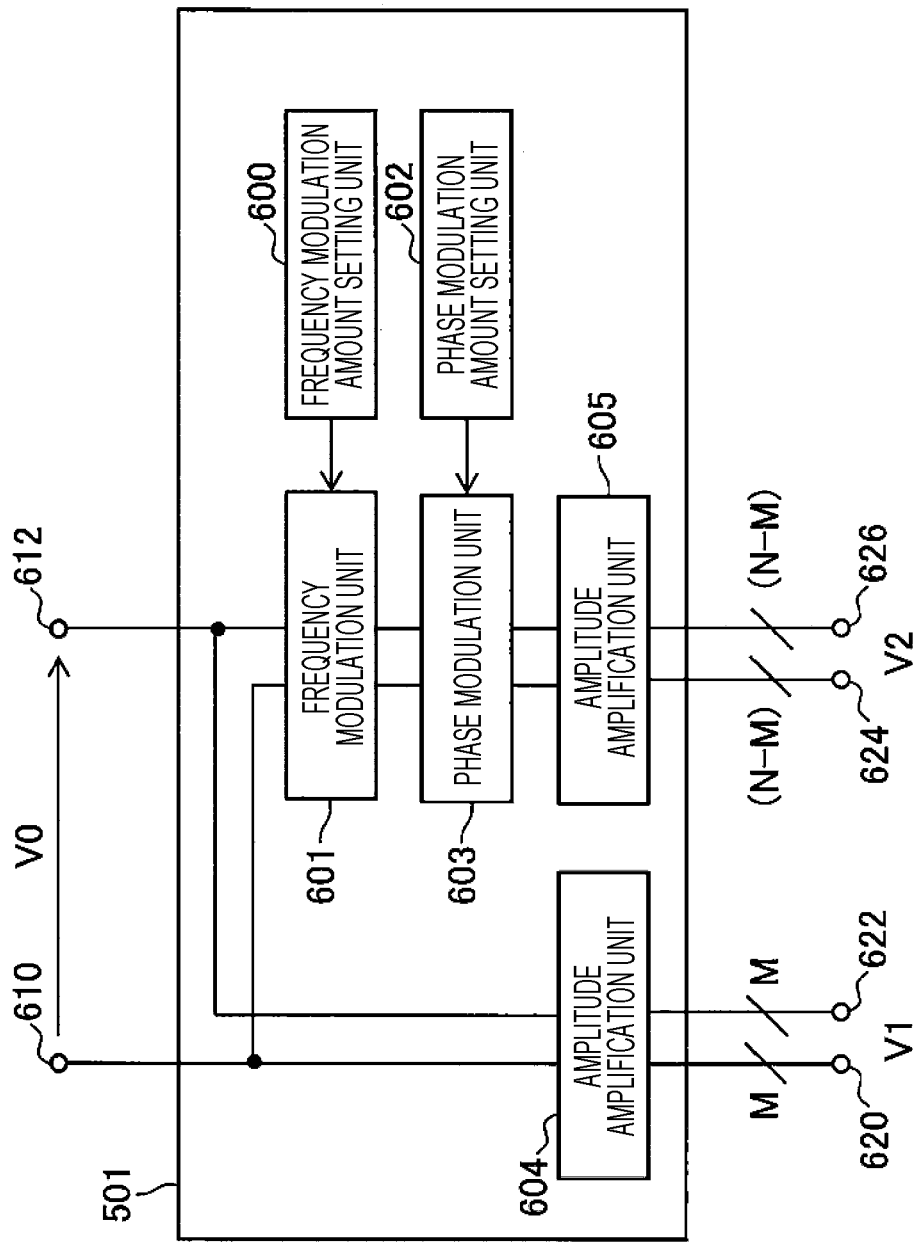
FIG. 6 is a block diagram illustrating a configuration of an excitation circuit.

FIG. 6 is a block diagram illustrating a configuration of the excitation circuit 501 illustrated in FIG. 5.

The excitation circuit 501 includes a pair of input terminals 610 and 612, a frequency modulation amount setting unit 600, a frequency modulation unit 601, a phase modulation amount setting unit 602, a phase modulation unit 603, amplitude amplification units 604 and 605, and a plurality of output terminals 620 to 626.

The input terminals 610 and 612 receive an output signal (sinusoidal AC voltage) from the oscillation circuit 104 (see FIG. 5), as an input voltage V0. The amplitude amplification unit 604 amplifies the amplitude of this AC voltage and outputs the result via the output terminals 620 and 622 of M systems. The output voltage from the amplitude amplification unit 604 is referred to as an excitation voltage V1 (first excitation voltage). The number M of systems is a number as a result of dividing the number N of systems of the magnetostrictive sensors 52-1 to 52-N by "2" and rounding up after the decimal point. The frequency modulation unit 601 performs frequency modulation on the AC voltage applied to the input terminals 610 and 612 as appropriate. The frequency modulation amount setting unit 600 sets the frequency modulation amount of the frequency modulation unit 601. The frequency modulation amount indicates whether frequency modulation is performed, and, when the frequency modulation is performed, indicates the frequency modulated.

The phase modulation unit 603 performs phase modulation on the output signal from the frequency modulation unit 601 as appropriate. The phase modulation amount setting unit 602 sets the phase modulation amount of the phase modulation unit 603. This phase modulation amount indicates whether the phase modulation is performed, and, when the phase modulation is performed, indicates the value of the phase modulated. The amplitude amplification unit 605 amplifies the amplitude of the output signal from the phase modulation unit 603 and outputs the result via the output terminals 624 and 626 of "N–M" systems. The output voltage of the amplitude amplification unit 605 is referred to as an excitation voltage V2 (second excitation voltage). Here, the frequency modulation unit 601, the phase modulation amount setting unit 602, and the amplitude amplification units 604 and 605 can be implemented with a general electric circuit, digital signal processing, and the like.

Figure 7:
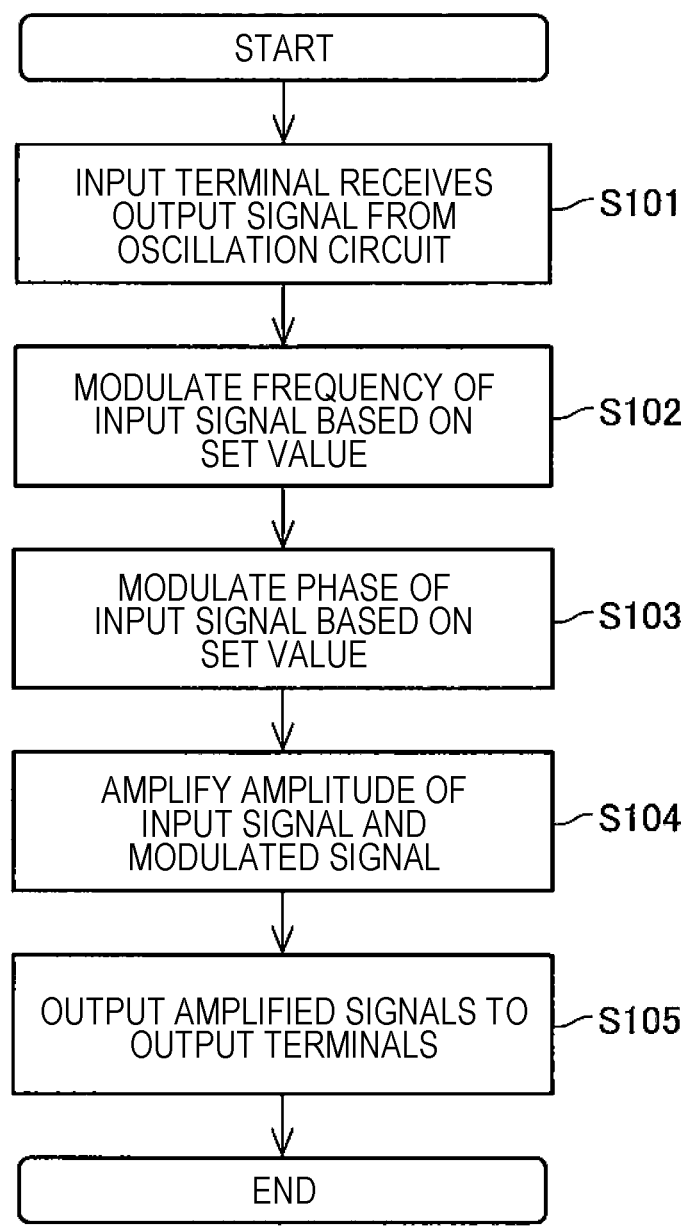
FIG. 7 is a flowchart illustrating an operation performed by the excitation circuit.

FIG. 7 is a flowchart illustrating an operation performed by the excitation circuit 501.

In FIG. 7, when the processing proceeds to step S101 (application step), the input terminals 610 and 612 of the excitation circuit 501 receive the output signal from the oscillation circuit 104 (see FIG. 4). Next, when the processing proceeds to step S102 (application step, frequency modulation step), the frequency modulation unit 601 (see FIG. 6) performs frequency modulation on the input signal (output signal from the oscillation circuit 104) based on a set value set by the frequency modulation amount setting unit 600. Next, when the processing proceeds to step S103 (application step, phase modulation step), the phase modulation unit 603 performs the phase modulation on the input signal (output signal from the frequency modulation unit 601) based on a set value set by the phase modulation amount setting unit 602.

Next, when the processing proceeds to step S104 (application step), the amplitude amplification unit 604 performs amplitude amplification on the input signal (output signal from the oscillation circuit 104). Similarly, the amplitude amplification unit 605 also performs amplitude amplification on the input signal (output signal from the phase modulation unit 603). Next, when the processing proceeds to step S105 (application step), the amplitude amplification unit 604 outputs the amplified signal as the excitation voltage V1 via the output terminals 620 and 622. Similarly, the amplitude amplification unit 605 outputs the amplified signal as the excitation voltage V2 via the output terminals 624 and 626.

(Configuration of Detector 502)

Figure 8:
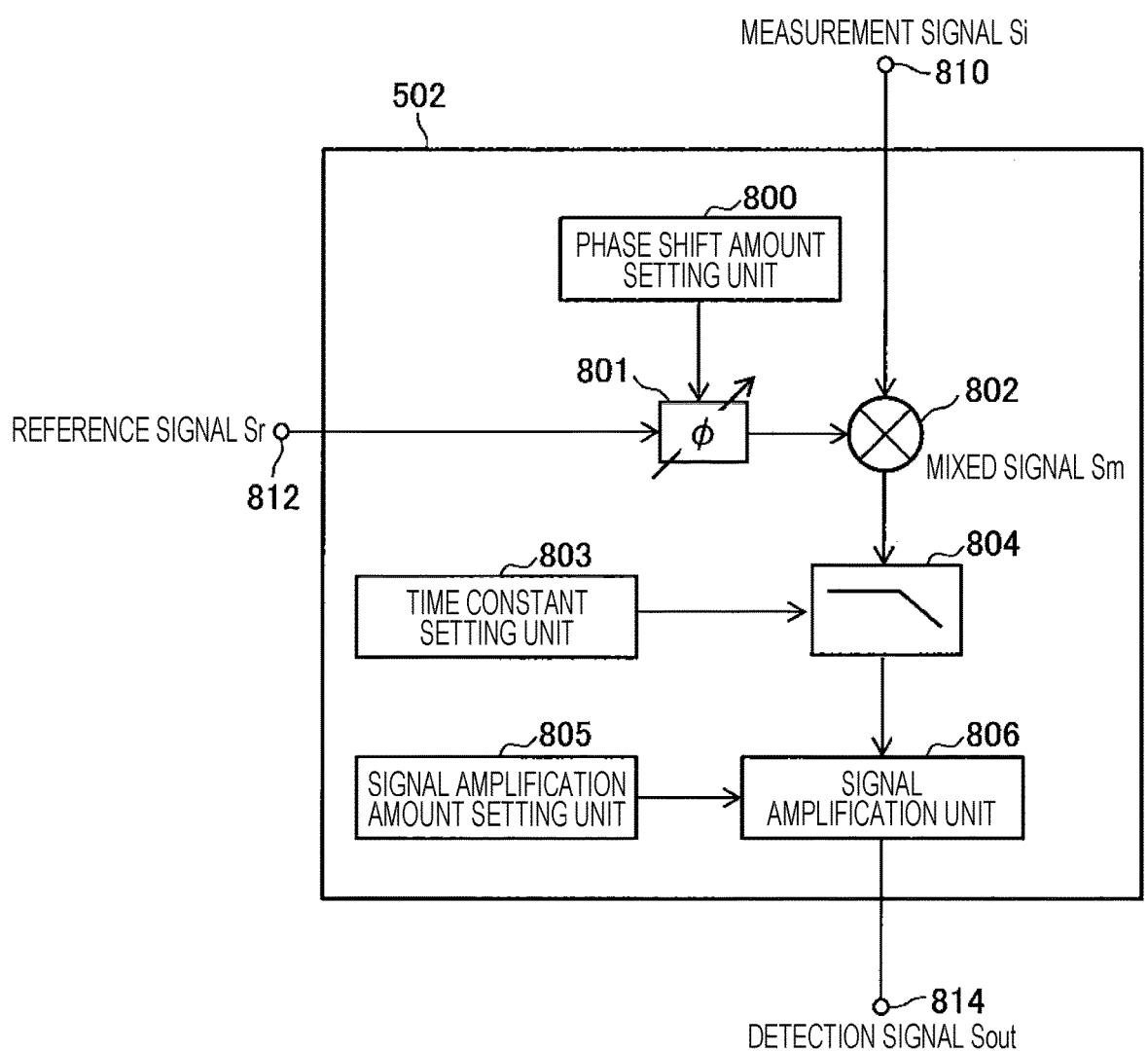
FIG. 8 is a block diagram illustrating a configuration of a detector.

FIG. 8 is a block diagram illustrating a configuration of the detectors 502 (that is, 502-1 to 502-N) forming the detection circuit 503 illustrated in FIG. 5.

The detectors 502 each include a phase shift amount setting unit 800, a phase shifter 801, a mixer 802, a time constant setting unit 803, an integrator 804, a signal amplification amount setting unit 805, a signal amplification unit 806, a measurement signal input terminal 810, a reference signal input terminal 812, and an output terminal 814.

The output signal of the detection coil 103 of the corresponding magnetostrictive sensor 52 (see FIG. 5) is input to the measurement signal input terminal 810 as a measurement signal Si. The excitation voltage applied to the excitation coil 101 of the magnetostrictive sensor 52 from the excitation circuit 501 (see FIG. 5) is supplied to the reference signal input terminal 812 as a reference signal Sr. The phase shifter 801 changes the phase of the reference signal Sr, and the phase shift amount setting unit 800 sets the amount of the phase shift by the phase shifter 801. The mixer 802 mixes (multiplies) the measurement signal Si and the phase-shifted reference signal Sr. The output signal from the mixer 802 is referred to as a mixed signal Sm.

The integrator 804 integrates the mixed signal Sm based on the time constant set. The integrator 804 also functions as a low pass filter. The time constant setting unit 803 sets the time constant used by the integrator 804. The signal amplification unit 806 amplifies the output signal from the integrator 804 and outputs the result as a detection signal Sout from the output terminal 814. The signal amplification amount setting unit 805 sets the amount of amplification by the signal amplification unit 806.

Here, the phase shifter 801, the mixer 802, the integrator 804, the signal amplification unit 806, and the like can be implemented with a general electric circuit, digital signal processing, and the like.

Figure 9:
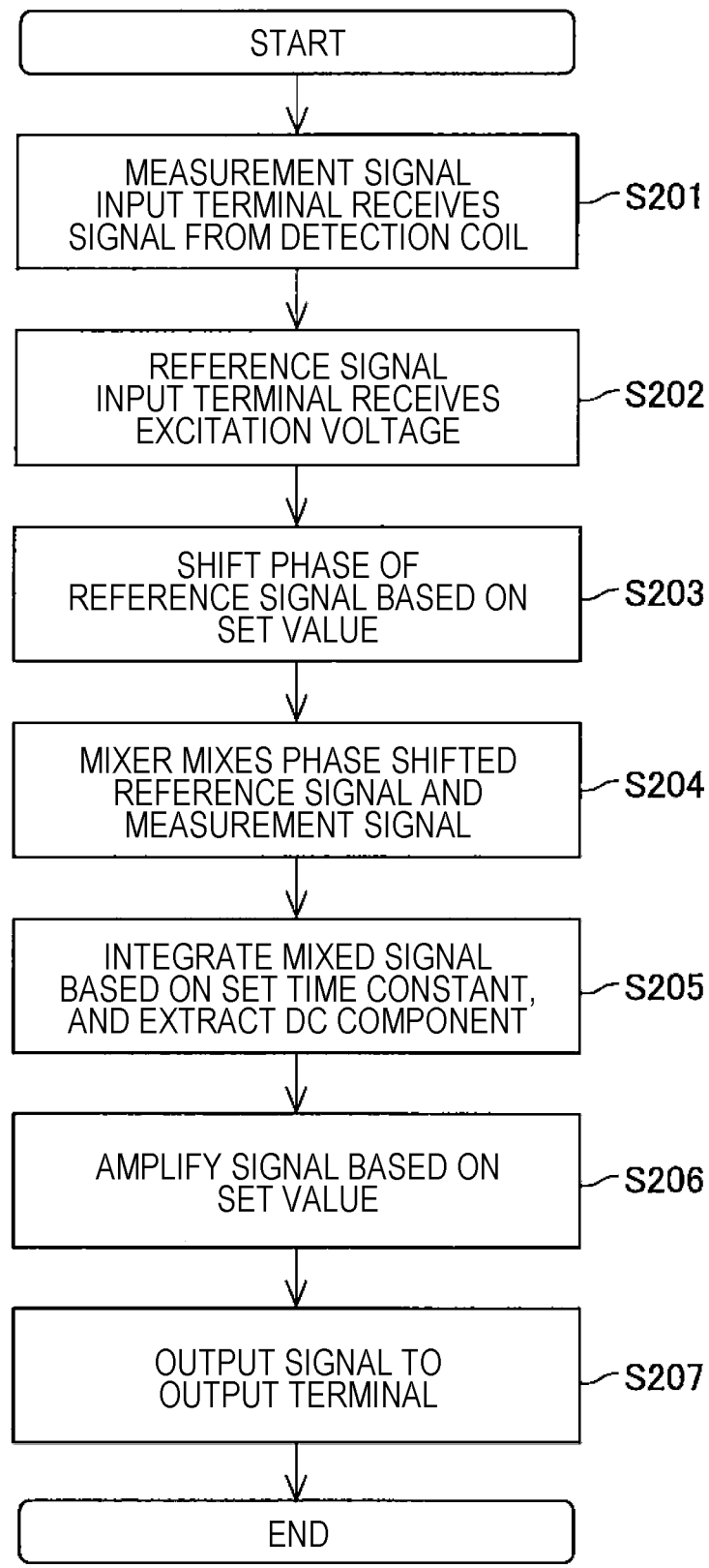
FIG. 9 is a flowchart illustrating an operation performed by the detector.

FIG. 9 is a flowchart illustrating an operation performed by the detector 502 (see FIG. 8).

In FIG. 9, when the processing proceeds to step S201 (synchronous detection step), the measurement signal input terminal 810 of the detector 502 receives the measurement signal Si from the detection coil 103. Next, when the processing proceeds to step S202 (synchronous detection step), the reference signal input terminal 812 of the detector 502 receives the excitation voltage applied to the excitation coil 101 from the excitation circuit 501 (see FIG. 5) as the reference signal Sr. Next, when the processing proceeds to step S203 (synchronous detection step, phase modulation step), the phase shifter 801 shifts the phase of the reference signal Sr by the amount of the phase shift set by the phase shift amount setting unit 800.

Next, when the processing proceeds to step S204 (synchronous detection step, mixing step), the mixer 802 mixes (multiplies) the phase-shifted reference signal Sr and the measurement signal Si, and outputs the result as the mixed signal Sm. Next, when the processing proceeds to step S205 (synchronous detection step, integration step), the integrator 804 integrates the output signal of the mixer 802 based on the time constant set by the time constant setting unit 803. As a result, the integrator 804 outputs a DC component of the mixed signal Sm. Next, when the processing proceeds to step S206 (synchronous detection step), the signal amplification unit 806 amplifies the output signal of the integrator 804 based on the amplification amount setting value set by the signal amplification amount setting unit 805. Next, when the processing proceeds to step S207 (synchronous detection step, signal amplification step), the detector 502 outputs the output signal of the signal amplification unit 806 via the output terminal 814.

With the stress distribution measurement device 50 configured as described above, the unmodulated excitation voltage V1 can be output from the output terminals 620 and 622 (see FIG. 6) of the excitation circuit 501, and the modulated excitation voltage V2 can be output from the output terminals 624 and 626. Then, of the magnetostrictive sensors 52-K illustrated in FIG. 5 (where 1≤K≤N), those with K being an odd number can have the excitation coil 101 receiving the unmodulated excitation voltage V1, and those with K being an even number can have the excitation coil 101 receiving the modulated excitation voltage V2.

Here, the frequency modulation amount and the phase modulation amount are preferably set by the frequency modulation amount setting unit 600 and the phase modulation amount setting unit 602 respectively so that the excitation voltages V1 and V2 form an orthogonal signal with orthogonal to each other. It should be noted that the expression "orthogonal" used in this specification indicates that independent signal paths can be formed. With the excitation voltages V1 and V2 being orthogonal to each other, crosstalk noise from the adjacent magnetostrictive sensors 52 can be removed. Even when the excitation voltages V1 and V2 do not provide ideal orthogonal signals, the crosstalk noise can be reduced by the detector 502.

(Example of Display Screen)

Figure 10:
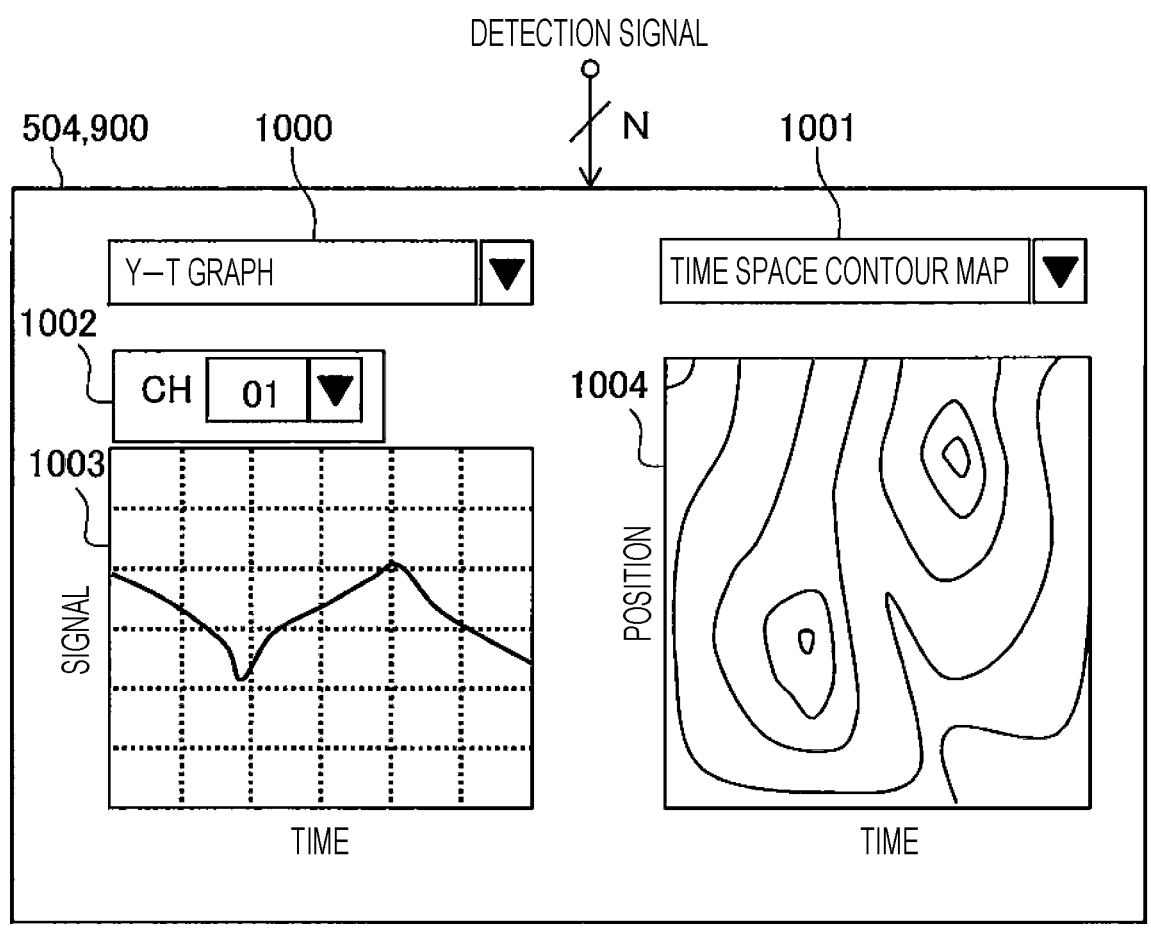
FIG. 10 is a diagram illustrating an example of a display screen displayed on a display device.

FIG. 10 is a diagram illustrating an example of a display screen 900 displayed on the display device 504 illustrated in FIG. 5.

In FIG. 10, the display screen 900 includes display mode selection units 1000 and 1001, a display sensor selection unit 1002, and display units 1003 and 1004. The display sensor selection unit 1002 designates one of the N magnetostrictive sensors 52-1 to 52-N based on an operation made by the user. The display unit 1003 displays the detection signal Sout (see FIG. 8) for the single magnetostrictive sensor 52-K (1≤K≤N) designated by the display sensor selection unit 1002.

The display mode selection unit 1000 selects the display mode for the detection signal Sout on the display unit 1003 based on an operation made by the user. The display unit 1004 displays a result of performing a complex calculation on the detection signals Sout of a plurality of systems related to the plurality of magnetostrictive sensors 52-1 to 52-N. The display mode selection unit 1001 selects the display mode for the display unit 1004 based on an operation made by the user.

An example of the display mode selectable by the display mode selection unit 1000 for a single detection signal includes a mode in which a change in the signal over time is displayed (Y-T graph), which is an illustrated example. An example of a display mode selectable by the display mode selection unit 1001 for a plurality of systems includes a mode in which the magnitude of the detection signal is displayed in a contour map (time space contour map) defined by two axes respectively representing time and position information about the magnetostrictive sensors, which is an illustrated example.

Figure 11:
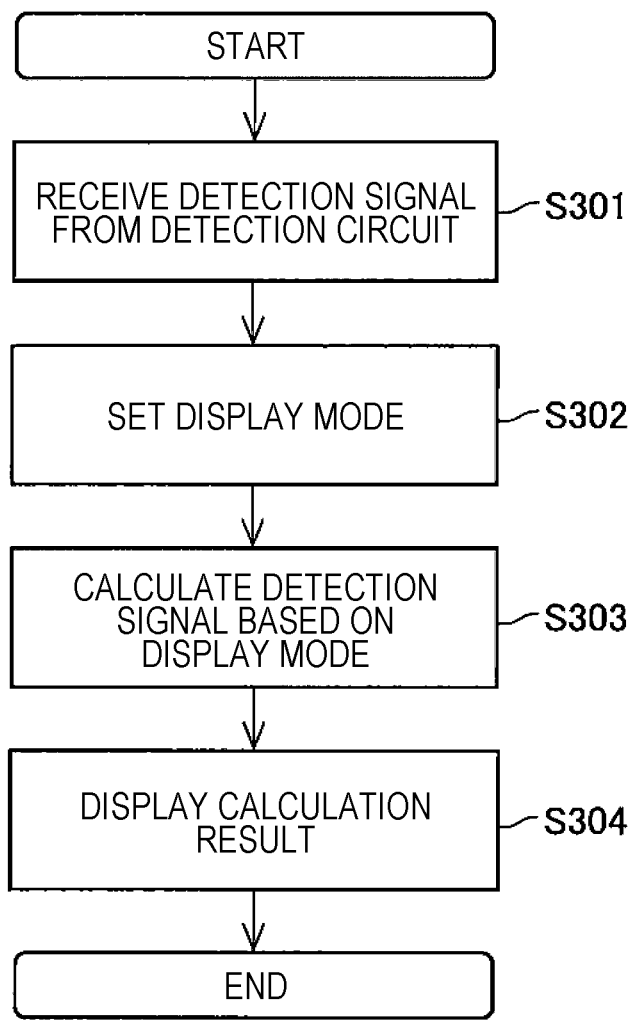
FIG. 11 is a flowchart illustrating an operation performed by the display device.

FIG. 11 is a flowchart illustrating an operation performed by the display device 504.

In FIG. 11, when the processing proceeds to step S301 (display step), the display device 504 receives the detection signal Sout of each detector 502 (see FIG. 5) from the detection circuit 503. Next, when the processing proceeds to step S302 (display step), the display mode selection unit 512 of the display device 504 sets the display mode for the display mode selection units 1000 and 1001 based on an operation made by the user. Next, when the processing proceeds to step S303 (display step, calculation step), the arithmetic processing unit 514 executes arithmetic processing on each detection signal Sout based on the display mode set.

Next, when the processing proceeds to step S304 (display step, image display step), the image display unit 516 (see FIG. 5) displays the calculation result on the display units 1003 and 1004. As described above, with the display device 504, a change in the stress distribution on the measurement target 106 (see FIG. 1) within a short period of time can be displayed to a user in an easily recognizable manner. The arithmetic processing executed in step S303 described above may be implemented through signal processing by an analog circuit or a digital circuit. This signal processing may also be executed by a computer.

<Sensitivity Calibration Method for Stress Distribution Measurement Device>

As described above, the excitation voltages V1 and V2 output from the excitation circuit 501 (see FIG. 6) preferably provide signals orthogonal to each other so that crosstalk noise can be reduced. The magnetostrictive response characteristics of the measurement target 106 may vary among frequencies. Therefore, if the frequency of the excitation voltage V2 is modulated so that the signals orthogonal to each other can be obtained, the detection sensitivity may vary among the magnetostrictive sensors 52 (see FIG. 5). This variation in detection sensitivity can be compensated by calibration of the sensitivity in advance. This will be described in detail below.

Figure 12:
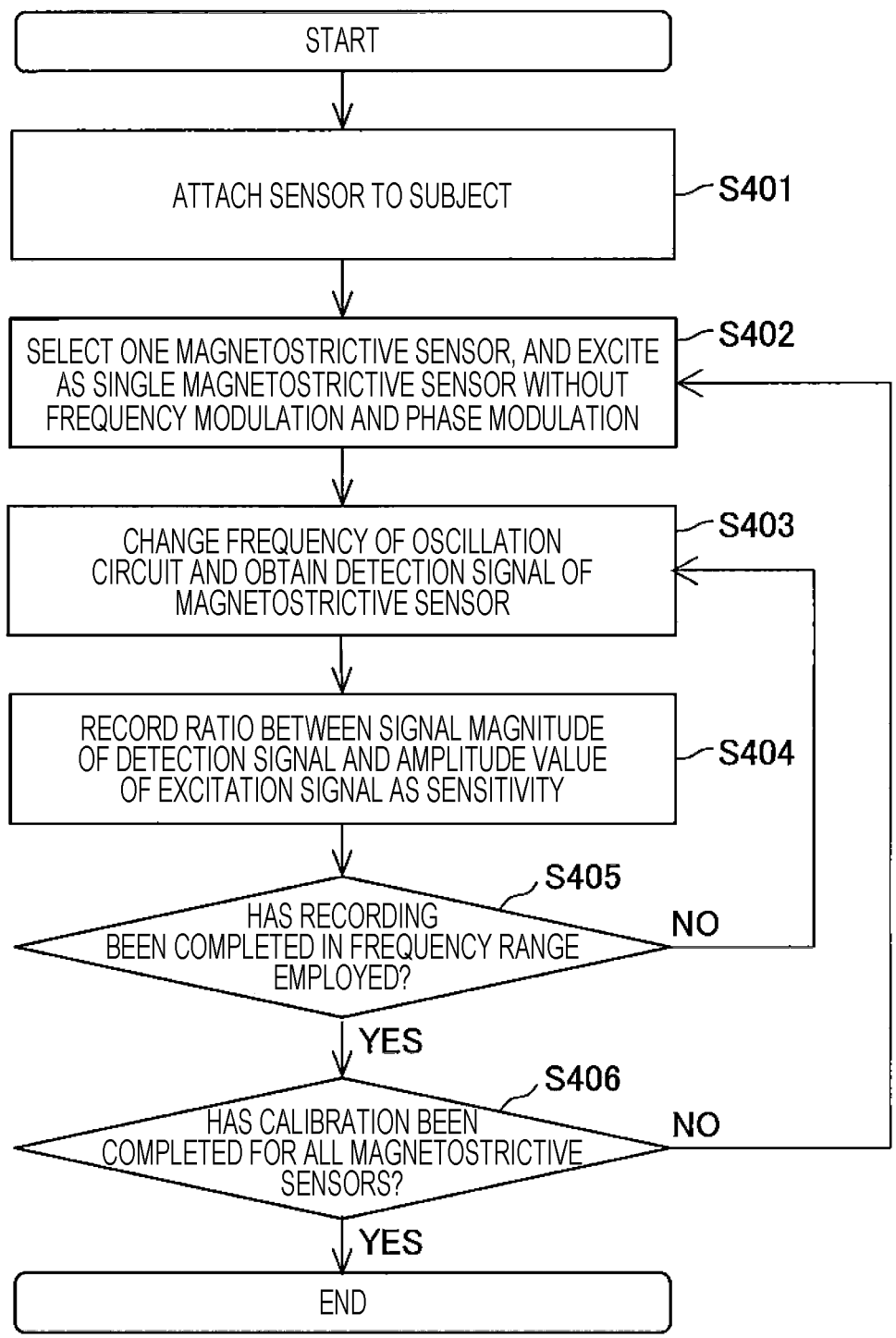
FIG. 12 is a flowchart of sensitivity calibration processing.

FIG. 12 is a flowchart of sensitivity calibration processing executed in the stress distribution measurement device 50.

When the processing proceeds to step S401 (sensor attachment step) in FIG. 12, the user attaches N magnetostrictive sensors 52-1 to 52-N on the measurement target 106. Next, when the processing proceeds to step S402 (excitation step), one magnetostrictive sensor 52-K (1≤K≤N) is selected to perform excitation as a single magnetostrictive sensor in the excitation circuit 501 with no frequency modulation or phase modulation.

Next, when the processing proceeds to step S403, the stress distribution measurement device 50 changes the excitation frequency f of the oscillation circuit 104 (see FIG. 1) to another excitation frequency to be measured, and the detection circuit 503 obtains the detection signal Sout of the magnetostrictive sensor. Next, when the processing proceeds to step S404 (recording step), the stress distribution measurement device 50 records, as sensitivity, a ratio (Sout/Sr) between the magnitude of the detection signal Sout obtained in step S403 and the amplitude value of the reference signal Sr (equal to either of the excitation voltages V1 and V2).

Next, when the processing proceeds to step S405, the stress distribution measurement device 50 determines whether the sensitivity recording is completed in the frequency range employed. Specifically, in this routine, the sensitivity is recorded for a plurality of excitation frequencies obtained by dividing the frequency range that can be adopted as the frequencies of the excitation voltages V1 and V2 at predetermined intervals. In step S405, whether the sensitivity has been recorded for all these excitation frequencies is determined.

When a result of the determination in step S405 is "No", the processing returns to step S403. Then, the stress distribution measurement device 50 changes the excitation frequency of the oscillation circuit 104 to another excitation frequency with which the detection signal Sout has not been obtained yet, and the detection circuit 503 obtains the detection signal Sout of the magnetostrictive sensor. On the other hand, when the recording has been completed in the frequency range employed, that is, when the processing in step S404 is completed for all the excitation frequencies, a result of the determination in step S405 is "Yes", and the processing proceeds to step S406.

At this point, the frequency characteristics of the detection signal Sout are acquired for the targeted magnetostrictive sensor 52-K, and the calibration is completed. In step S406, it is determined whether the calibration has been completed on all the magnetostrictive sensors 52-1 to 52-N. When a result of this determination is "No", the processing returns to step S402, another magnetostrictive sensor 52-K for which the calibration has not been completed yet is selected, and the processing in steps S403 to S406 are repeated. Then, when the calibration is completed for all the magnetostrictive sensors 52-1 to 52-N, the processing of this routine ends.

Figure 13:
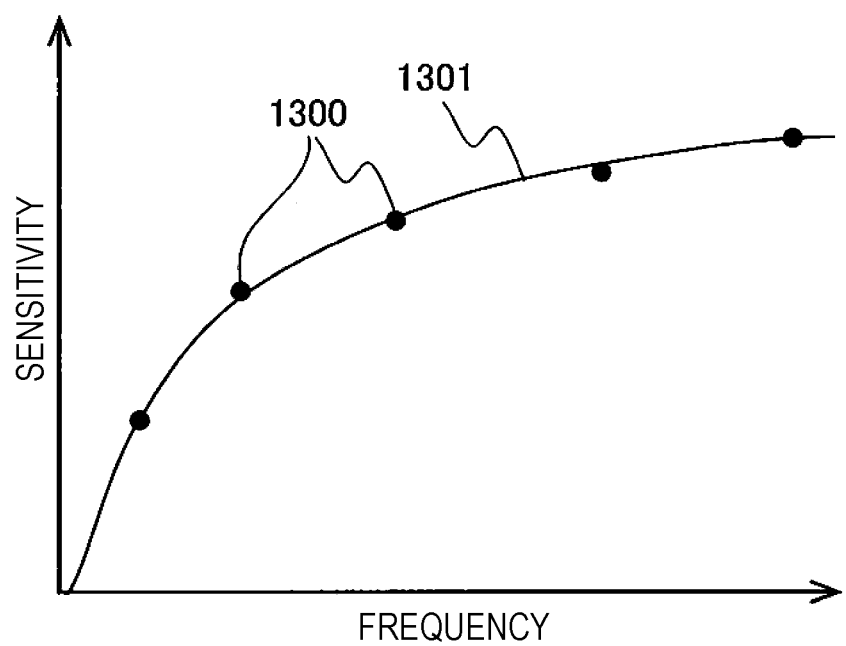
FIG. 13 is a diagram illustrating an example of a sensitivity calibration curve of a magnetostrictive sensor.

FIG. 13 is a diagram illustrating an example of a sensitivity calibration curve of a single magnetostrictive sensor obtained by the sensitivity calibration processing in FIG. 12.

Sensitivity measurement values 1300 ("Sout/Sr" described above) are plotted relative to a change in the frequency (the excitation frequency described above) indicated on the horizontal axis. Then, through interpolation between the sensitivity measurement values 1300, a sensitivity calibration curve 1301 can be obtained. In the stress distribution measurement device 50, the signal amplification amount setting unit 805 (see FIG. 8) of the detector 502 sets the amplification amount based on the obtained sensitivity measurement values 1301 when the stress distribution is measured. As a result, even when the magnetostriction response characteristics of the measurement target 106 vary depending on the frequency, a change in the stress distribution can be accurately measured.

Here, the method of interpolating between the sensitivity measurement values 1300 can be a method of obtaining by calculation such as linear interpolation, or a method of obtaining by least squares under the assumption that "the sensitivity measurement values 1301 correspond to an appropriate model formula", for example, "proportional to the square root of the frequency".

Note that the amount of the phase shift set in the phase shift amount setting unit 800 in the detection circuit 503 is also measured in advance so that the detection sensitivity of the single magnetostrictive sensor in the measurement target 106 becomes maximum, and thus the sensitivity can be calibrated by the same procedure as the calibration described above.

In this way, it is possible to measure a change in the stress distribution in a short period of time by using a magnetostrictive stress measurement method capable of measuring the surface stress of a metal product or the like in a non-contact manner.

<Modifications>

The present invention is not limited to the above-described embodiment, and various modifications can be made. The above-described embodiment is described in order to explain the present invention in an easily understandable manner, and the present invention is not necessarily limited to a system having all the described configurations. Furthermore, another configuration may be added to the configuration of the above-described embodiment, and a part of the configuration may be replaced with another configuration. Furthermore, the control lines and information lines illustrated in the drawings are those considered necessary for the explanation, and not all the control lines and information lines required for the product are necessarily illustrated. In fact, it can be considered that almost all configurations are connected to each other. Possible modifications to the above embodiment are, for example, as follows.

(1) Regarding the excitation circuit 501 (see FIG. 6) in the above embodiment, the input voltage V0 is frequency-modulated, and the result is phase-modulated and output as the excitation voltage V2. However, the order of frequency modulation and phase modulation may be interchanged.

(2) Regarding the excitation circuit 501 (see FIG. 6) in the above embodiment, a result of performing both frequency modulation and phase modulation on the input voltage V0 is output as the excitation voltage V2. However, a result of performing only one of frequency modulation and phase modulation may be output as the excitation voltage V2.

(3) Regarding the excitation circuit 501 (see FIG. 6) in the above embodiment, the result of directly amplifying the input voltage V0 is output as the excitation voltage V1. However, similarly to the excitation voltage V2, a result of performing frequency modulation or phase modulation on the input voltage V0 may be output as the excitation voltage V1.

(4) Regarding the excitation circuit 501 (see FIG. 6) in the above-described embodiment, a sine wave, a result of performing frequency modulation on a sine wave, a result of performing phase modulation on a sine wave, or a result of performing both phase modulation and frequency modulation on a sine wave. is output as the excitation voltage V1 or V2. However, the excitation voltages V1 and V2 other than these may be adopted. For example, the excitation voltage V1 may be a result of spreading a DC voltage with a certain spreading code, and the excitation voltage V2 may be a result of spreading a DC voltage with another spreading code orthogonal to the excitation voltage V1. In this case, the detection circuit 503 may be configured to execute decoding based on these spread codes.

(5) Since the hardware of the excitation circuit 501, the detection circuit 503, and the display device 504 in the above-described embodiment can be implemented by a general computer, programs and the like for executing the flowcharts shown in FIGS. 7, 9, 11, and 12 and other various processes described above may be stored in a storage medium or distributed via a transmission line.

Effects of the Embodiment

As described above, a stress distribution measurement device (50) according to the present embodiment includes: an excitation circuit (501) that applies a first excitation voltage (V1) to an excitation coil (101) of a first magnetostrictive sensor (52-1) and applies a second excitation voltage (V2) to an excitation coil (101) of a second magnetostrictive sensor (52-2), the second excitation voltage (V2) having a phase or a waveform different from the first excitation voltage (V1); and a detection circuit (503) that includes a first detector (502-1) that performs synchronous detection of current flowing in a detection coil (103) of the first magnetostrictive sensor (52-1) based on the first excitation voltage (V1) and a second detector (502-2) that performs synchronous detection of current flowing in the detection coil (103) of the second magnetostrictive sensor (52-2) based on the second excitation voltage (V2).

With the current flowing in the detection coils (103) of the first and the second magnetostrictive sensors (52-1 and 52-2) thus detected by synchronous detection, the stress can be swiftly measured while the crosstalk noise is suppressed. Thus, the stress one the measurement target (106) can be appropriately measured.

The excitation circuit (501) includes a frequency modulation unit (601) that makes the first excitation voltage and the second excitation voltage (V1 and V2) have a frequency difference, a phase modulation unit (603) that makes the first excitation voltage and the second excitation voltage (V1 and V2) have a phase difference, a frequency modulation amount setting unit (600) that sets a frequency modulation amount of the frequency modulation unit (601), and a phase modulation amount setting unit (602) that sets a phase modulation amount of the phase modulation unit (603), and the frequency difference or the phase difference between the first excitation voltage and the second excitation voltage (V1 and V2) is set with an output signal of the frequency modulation unit (601) or the phase modulation unit (603) applied as the second excitation voltage (V2).

With this configuration, the first and the second excitation voltages (V1 and V2) can be different from each other in phase or frequency, whereby the crosstalk noise between the first and the second magnetostrictive sensors (52-1 and 52-2) can be more effectively suppressed.

The first detector and the second detector (502-1 and 502-2) each include a phase shifter (801) that shifts a phase of a reference signal (Sr) that is the first excitation voltage or the second excitation voltage (V1 or V2), a phase shift amount setting unit (800) that sets a phase shift amount of the phase shifter (801), a mixer (802) that mixes a measurement signal (Si) that is an output signal from the first magnetostrictive sensor or the second magnetostrictive sensor (52-1 or 52-2) and an output signal from the phase shifter (801) to generate a mixed signal (Sm), an integrator (804) that integrates the mixed signal (Sm), a time constant setting unit (803) that sets a time constant used by the integrator (804), a signal amplification unit (806) that amplifies an integration result from the integrator (804), and a signal amplification amount setting unit (805) that sets a signal amplification amount of the signal amplification unit (806).

With this configuration, appropriate simultaneous detection of the measurement signal (Si) can be achieved with the phase shift amount setting unit (800), the phase shifter (801), the mixer (802), the time constant setting unit (803), and the integrator (804), whereby the crosstalk noise can be even more effectively suppressed.

The stress distribution measurement device (50) further comprising a display device (504) including: a display mode selection unit (512) that selects a display mode of an output signal from the detection circuit (503); an arithmetic processing unit (514) that executes arithmetic processing based on the display mode selected; and an image display unit (516) that displays an arithmetic result obtained by the arithmetic processing unit (514) as an image.

With this configuration, the user can make the output signal from the detection circuit (503) displayed in a desired mode.

A stress distribution measurement method according to the present embodiment includes attaching (S401) the first magnetostrictive sensor or the second magnetostrictive sensor (52-1 and 52-2) to the measurement target (106), exciting (S402) the first magnetostrictive sensor or the second magnetostrictive sensor (52-1 or 52-2) with the first excitation voltage or the second excitation voltage (V1 or V2), and recording (S404) a ratio between the first excitation voltage (V1) and an output signal from the first magnetostrictive sensor (52-1) or a ratio between the second excitation voltage (V2) and an output signal from the second magnetostrictive sensor (52-2) with an excitation frequency of the first excitation voltage or the second excitation voltage (V1 or V2) changed, to obtain the sensitivity calibration curve.

As a result, even when the magnetostriction response characteristics of the measurement target (106) vary depending on the frequency, a change in the stress distribution can be accurately measured.

What is claimed is:

1. A stress distribution measurement device comprising:
a first magnetostrictive sensor and a second magnetostrictive sensor each including an excitation coil that excites AC magnetism in a measurement target using alternating current, and a detection coil to which alternating current is induced due to the AC magnetism flowing in the measurement target;
an excitation circuit that applies a first excitation voltage to the excitation coil of the first magnetostrictive sensor and applies a second excitation voltage to the excitation coil of the second magnetostrictive sensor, the second excitation voltage having a phase or a waveform different from the first excitation voltage; and
a detection circuit that includes a first detector that performs synchronous detection of current flowing in the detection coil of the first magnetostrictive sensor based on the first excitation voltage and a second detector that performs synchronous detection of current flowing in the detection coil of the second magnetostrictive sensor based on the second excitation voltage, wherein
the excitation circuit includes
a frequency modulation unit that makes the first excitation voltage and the second excitation voltage have a frequency difference,
a phase modulation unit that makes the first excitation voltage and the second excitation voltage have a phase difference,
a frequency modulation amount setting unit that sets a frequency modulation amount of the frequency modulation unit, and
a phase modulation amount setting unit that sets a phase modulation amount of the phase modulation unit, and
the frequency difference or the phase difference between the first excitation voltage and the second excitation voltage is set with an output signal of the frequency modulation unit or the phase modulation unit applied as the second excitation voltage.

2. A stress distribution measurement device comprising:
a first magnetostrictive sensor and a second magnetostrictive sensor each including an excitation coil that excites AC magnetism in a measurement target using alternating current, and a detection coil to which alternating current is induced due to the AC magnetism flowing in the measurement target;
an excitation circuit that applies a first excitation voltage to the excitation coil of the first magnetostrictive sensor and applies a second excitation voltage to the excitation coil of the second magnetostrictive sensor, the second excitation voltage having a phase or a waveform different from the first excitation voltage; and
a detection circuit that includes a first detector that performs synchronous detection of current flowing in the detection coil of the first magnetostrictive sensor based on the first excitation voltage and a second detector that performs synchronous detection of current flowing in the detection coil of the second magnetostrictive sensor based on the second excitation voltage, wherein
the first detector and the second detector each include
a phase shifter that shifts a phase of a reference signal that is the first excitation voltage or the second excitation voltage,
a phase shift amount setting unit that sets a phase shift amount of the phase shifter,
a mixer that mixes a measurement signal that is an output signal from the first magnetostrictive sensor or the second magnetostrictive sensor and an output signal from the phase shifter to generate a mixed signal,
an integrator that integrates the mixed signal,
a time constant setting unit that sets a time constant used by the integrator,
a signal amplification unit that amplifies an integration result from the integrator, and
a signal amplification amount setting unit that sets a signal amplification amount of the signal amplification unit.

3. A stress distribution measurement device comprising:
a first magnetostrictive sensor and a second magnetostrictive sensor each including an excitation coil that excites AC magnetism in a measurement target using alternating current, and a detection coil to which alternating current is induced due to the AC magnetism flowing in the measurement target;
an excitation circuit that applies a first excitation voltage to the excitation coil of the first magnetostrictive sensor and applies a second excitation voltage to the excitation coil of the second magnetostrictive sensor, the second excitation voltage having a phase or a waveform different from the first excitation voltage;
a detection circuit that includes a first detector that performs synchronous detection of current flowing in the detection coil of the first magnetostrictive sensor based on the first excitation voltage and a second detector that performs synchronous detection of current flowing in the detection coil of the second magnetostrictive sensor based on the second excitation voltage; and
a display device including:
a display mode selection unit that selects a display mode of an output signal from the detection circuit;
an arithmetic processing unit that executes arithmetic processing based on the display mode selected; and
an image display unit that displays an arithmetic result obtained by the arithmetic processing unit as an image.

4. A stress distribution measurement method comprising:
applying, by an excitation circuit, a first excitation voltage and a second excitation voltage to excitation coils of a first magnetostrictive sensor and a second magnetostrictive sensor respectively, the first magnetostrictive sensor and the second magnetostrictive sensor each including the excitation coil that excites AC magnetism in a measurement target using alternating current and a detection coil to which alternating current is induced due to the AC magnetism flowing in the measurement target; and
synchronously detecting current flowing in the detection coil of the first magnetostrictive sensor based on the first excitation voltage and synchronously detecting current flowing in the detection coil of the second magnetostrictive sensor based on the second excitation voltage, wherein the applying includes
modulating a frequency to make the first excitation voltage and the second excitation voltage have a frequency difference, and
modulating a phase to make the first excitation voltage and the second excitation voltage have a phase difference.

5. A stress distribution measurement method comprising:
applying, by an excitation circuit, a first excitation voltage and a second excitation voltage to excitation coils of a first magnetostrictive sensor and a second magnetostrictive sensor respectively, the first magnetostrictive sensor and the second magnetostrictive sensor each including the excitation coil that excites AC magnetism in a measurement target using alternating current and a detection coil to which alternating current is induced due to the AC magnetism flowing in the measurement target; and
synchronously detecting current flowing in the detection coil of the first magnetostrictive sensor based on the first excitation voltage and synchronously detecting current flowing in the detection coil of the second magnetostrictive sensor based on the second excitation voltage, wherein the synchronously detecting includes
modulating a phase of a reference signal that is the first excitation voltage or the second excitation voltage based on a set value,
mixing a phase modulation result obtained by the modulating the phase and a measurement signal that is an output signal from the first magnetostrictive sensor or the second magnetostrictive sensor to generate a mixed signal,
integrating the mixed signal based on a time constant set, and
amplifying an integration result obtained by the integrating, based on a signal amplification amount set.

6. A stress distribution measurement method comprising:
applying, by an excitation circuit, a first excitation voltage and a second excitation voltage to excitation coils of a first magnetostrictive sensor and a second magnetostrictive sensor respectively, the first magnetostrictive sensor and the second magnetostrictive sensor each including the excitation coil that excites AC magnetism in a measurement target using alternating current and a detection coil to which alternating current is induced due to the AC magnetism flowing in the measurement target;
synchronously detecting current flowing in the detection coil of the first magnetostrictive sensor based on the first excitation voltage and synchronously detecting current flowing in the detection coil of the second magnetostrictive sensor based on the second excitation voltage; and
displaying a synchronous detection result obtained by the synchronously detecting, wherein
the displaying includes
executing arithmetic processing on the synchronous detection result based on a display mode selected, and
displaying an image of an arithmetic result obtained by the executing arithmetic processing.

7. The stress distribution measurement method according to claim 5, wherein the amplifying includes determining the signal amplification amount based on a sensitivity calibration curve of the first magnetostrictive sensor or the second magnetostrictive sensor.

8. The stress distribution measurement method according to claim 7 further comprising
attaching the first magnetostrictive sensor or the second magnetostrictive sensor to the measurement target,
exciting the first magnetostrictive sensor or the second magnetostrictive sensor with the first excitation voltage or the second excitation voltage, and
recording a ratio between the first excitation voltage and an output signal from the first magnetostrictive sensor or a ratio between the second excitation voltage and an output signal from the second magnetostrictive sensor with an excitation frequency of the first excitation voltage or the second excitation voltage changed,
to obtain the sensitivity calibration curve.

\* \* \* \* \*